(12) United States Patent
Fluegel

(10) Patent No.: US 9,081,743 B2
(45) Date of Patent: Jul. 14, 2015

(54) COMMUNICATION SYSTEM AND COMMUNICATON METHOD

(75) Inventor: Sebastian Fluegel, Ottobrunn (DE)

(73) Assignee: PRO DESIGN Electronic GmbH, Bruckmuehl (DE)

( * ) Notice: Subject to any disclaimer, the term of this patent is extended or adjusted under 35 U.S.C. 154(b) by 477 days.

(21) Appl. No.: 13/481,662

(22) Filed: May 25, 2012

(65) Prior Publication Data

US 2013/0318223 A1 Nov. 28, 2013

(51) Int. Cl.
*G06F 17/50* (2006.01)
*G06F 15/173* (2006.01)

(52) U.S. Cl.
CPC ...... *G06F 15/17306* (2013.01); *G06F 17/5054* (2013.01)

(58) Field of Classification Search
None
See application file for complete search history.

(56) References Cited

U.S. PATENT DOCUMENTS

| | | | | |
|---|---|---|---|---|
| 4,556,939 | A * | 12/1985 | Read | 710/305 |
| 5,245,616 | A * | 9/1993 | Olson | 714/748 |
| 6,424,870 | B1 * | 7/2002 | Maeda et al. | 700/4 |
| 7,441,059 | B2 | 10/2008 | Mauersberger et al. | |
| 7,856,534 | B2 * | 12/2010 | Van Doren et al. | 711/141 |
| 7,895,280 | B2 * | 2/2011 | Allen et al. | 709/206 |
| 2011/0298596 | A1 * | 12/2011 | Warrick | 340/12.53 |

* cited by examiner

*Primary Examiner* — Leigh Garbowski
(74) *Attorney, Agent, or Firm* — Studebaker & Brackett PC

(57) ABSTRACT

A communication system includes a first interface module which can be coupled to a first logic unit and a second interface module which can be coupled to a second logic unit. The first and second interface modules are interconnected by a virtual channel over a routing network. The first interface module is configured to receive messages from the first interface module and to send the received messages over the virtual channel to the second interface module. The second interface module is configured to transmit the received messages to the second logic unit. The second interface module is further configured to receive a processing complete signal from the second logic unit when the received messages have been processed in the second logic unit and is further configured to send an acknowledgement signal to the first interface module after reception of the processing complete signal. Further a communication method is provided.

16 Claims, 8 Drawing Sheets

COMMUNICATION SYSTEM AND COMMUNICATON METHOD

FIELD OF THE INVENTION

The invention is in the field of communication. The invention is more particular in the field of communication between logic units and may be used in a test system for logic units.

BACKGROUND

In the context of the present invention, a logic unit designates a digital functional block which may receive data and/or send data. The data may include instructions. Logic units may be dedicated to a specific data processing operation or programmable to perform a class of data processing operations. Generally, logic units are characterized to generate data (only send), to consume data (only receive), or to transform data (send and receive). Examples for data processing operations are multimedia signal processing, communication protocol processing, and system maintenance and monitoring operations.

Logic units can be realized as software applications running on a computer. Logic units realized as software applications are described in a programming language, for example in C or C++. Logic units can also be realized inside a Field Programmable Gate Array (FPGA). Logic units realized in an FPGA are described in a Hardware Description Language (HDL), for example in the languages VHDL or Verilog and will be called HDL design entities or HDL entities in the present specification. Logic units may also be realized in integrated circuits. Logic units realized or to be realized in integrated circuits may be simulated by logic units realized in an FPGA. An FPGA may comprise a plurality of logic units.

An FPGA system comprises multiple Field Programmable Gate Arrays and an infrastructure that allows users to utilize the FPGAs. In an FPGA system a logic unit may also be distributed on several FPGAs. The FPGAs are configured by transmitting the HDL description onto the FPGAs. The structure of the circuitry inside the FPGA is thus defined and a dedicated logic circuit comprising a logic unit or logic units is configured. An FPGA system may be used either as Rapid Prototyping Platform or as a so called supercomputer.

For Rapid Prototyping, a digital system developer writes a HDL description of an intended digital processing system to be manufactured as an integrated circuit, for example a Si-chip (Si —silicon). An FPGA system may be used to map or emulate the behavior of the chip, i.e. the HDL description is loaded onto the FPGA system. Additionally, if the digital processing system contains programmable logic, the FPGA system allows software engineers to start working before the actual chip is available. They may program on the FPGA system. This allows the digital system developer to debug the HDL using full-size applications, where all elements of the final Si-chip and the required application software running on programmable data processing unit inside the Si-chip are running.

The HDL design may be processed by Electronic Design Automation (EDA) tools. Although different EDA tools are needed to generate chip production files and FPGA configuration files, the HDL description is the same (except for some technology-specific parts). Errors in the HDL description can therefore be already detected in the FPGA system, i.e. prior to tape-out of the silicon production files, thus reducing both cost and development time.

For supercomputing, the HDL description utilizes the highly parallel and regular nature of the FPGA architecture for the acceleration of equally parallel and regular computations.

One of the key features provided by any FPGA system's infrastructure is a communication access. Communication is required for example for transferring the FPGA configuration bit stream from a remote location, for debugging the HDL design inside the FPGAs, and for collaboration between software running on a remote machine and HDL designs running inside the FPGAs. Modern FPGA systems may be connected to a Host PC through a device access unit (DAU).

Communication is further needed for data transfer between logic units. Difficulties for the communication may arise from the different kinds of logic units, realized as software applications and/or as HDL entities. Communication may further be hindered by different processing speed of different logic units and by a different size of data units required by different logic units.

BRIEF DESCRIPTION OF THE DRAWINGS

The accompanying drawings, which are incorporated in and constitute a part of this specification, illustrate one or more embodiments described herein and, together with the description, explain the embodiments. In the drawings.

DETAILED DESCRIPTION OF PREFERRED EMBODIMENTS

The following detailed description refers to the accompanying drawings. The same reference numbers in different drawings may identify the same or similar elements.

Figure 1:
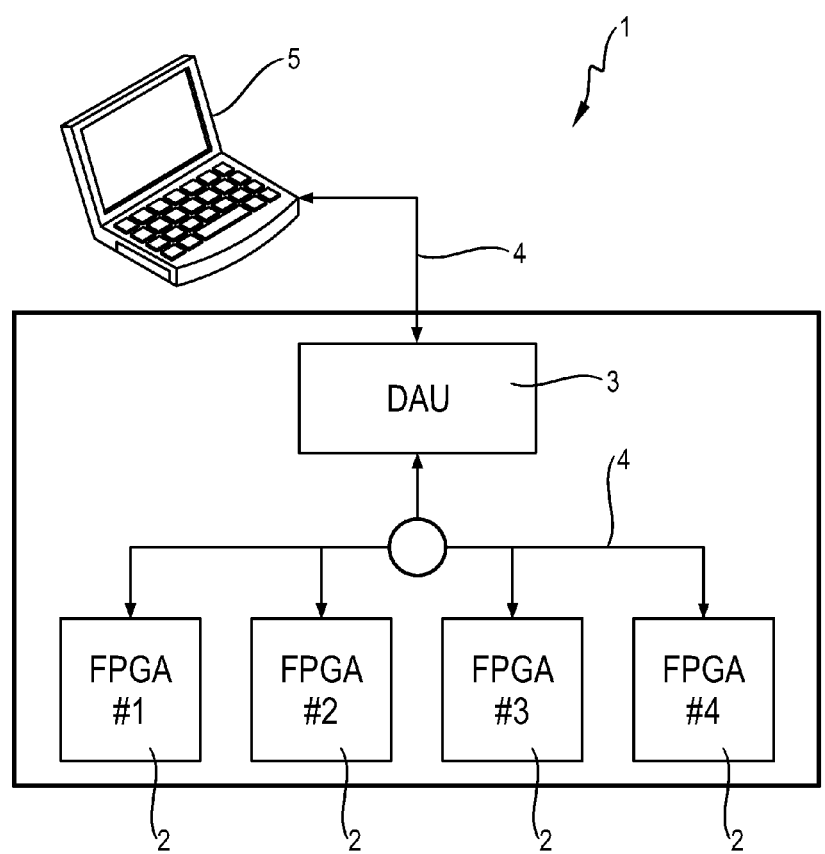
FIG. 1 is a diagram of an exemplary FPGA system.

FIG. 1 shows in a simplified diagram an FPGA system 1 which may implement the inventive communication system and method. In the embodiment shown, the FPGA system 1 comprises four FPGAs 2, which are numbered as FPGA #1, FPGA #2, FPGA #3 and FPGA #4, respectively. The FPGA system 1 further comprises a digital access unit (DAU) 3. The digital access unit 3 and the FPGAs 2 are interconnected by a routing network 4. The routing network 4 may be realized by wires, printed lines or any communication lines including wireless communication. A computer 5 is connected via digital access unit 3 and routing network 4 to the FPGAs 2. In particular, FPGA system 1 may be used for testing the logic circuit loaded into the FPGAs 2.

In operation, there may be a communication between different FPGAs 2 and between computer 5 and different FPGAs 2. More specifically, there may be a communication between different logic units comprised in the computer 5 and/or in the FPGAs 2. The communication passes over the routing network 4. Each FPGA 2 may comprise several logic units which are HDL design entities. Communication occurs between different logic units, i.e. communication may also occur inside an FPGA. Computer 5 may comprise software programs which comprise several logic units which are software applications, i.e. communication may also occur inside the computer 5. There are communications between logic units of the same kind, for example between HDL design entities or between software applications, but also between logic units of different kind, i.e. between a HDL design entity and a software application. Especially in a test environment, the logic units which must communicate with each other may change.

Figure 2:
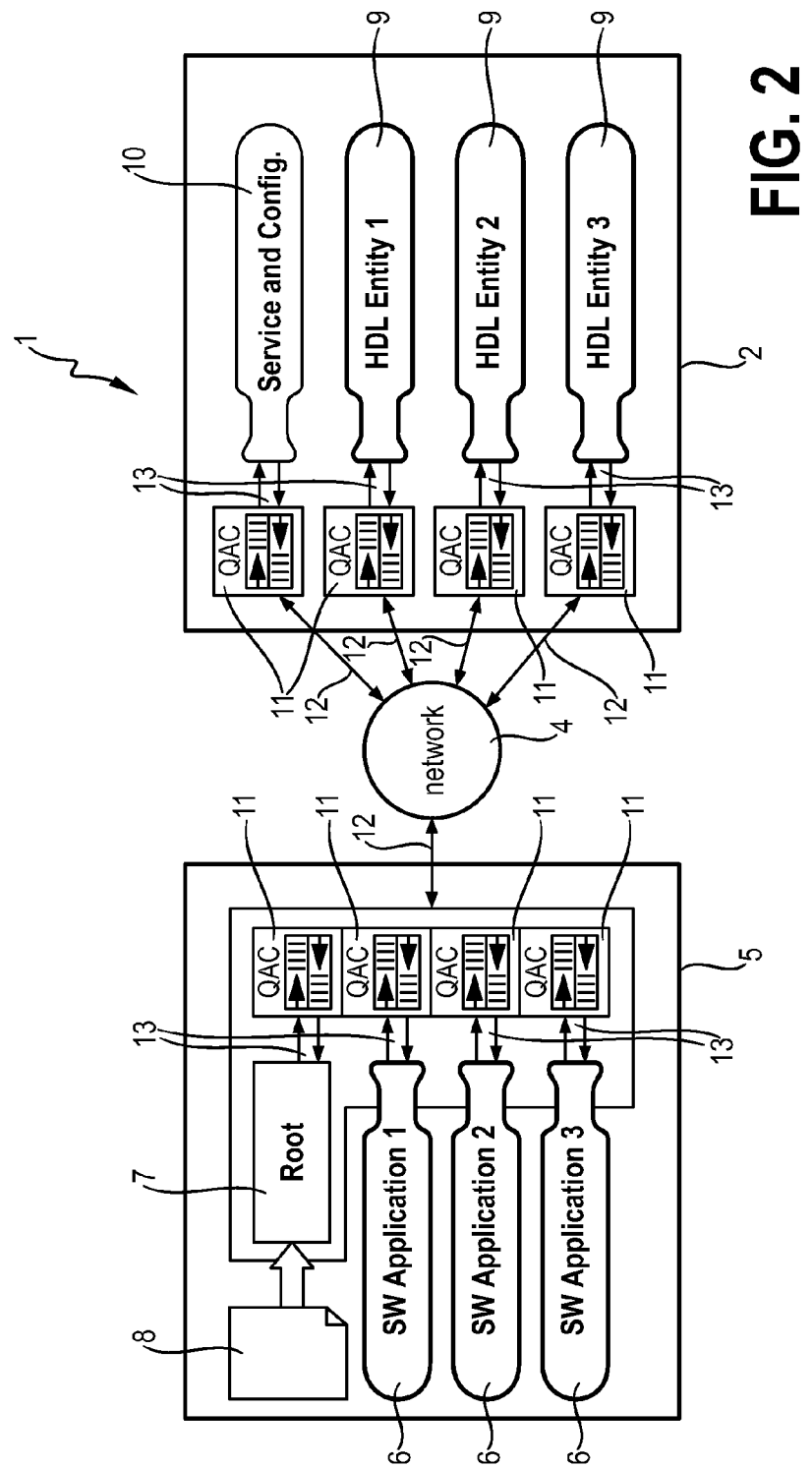
FIG. 2 is a diagram of an exemplary embodiment of a communication system according to the invention.

FIG. 2 shows another representation of the FPGA system 1. A box 5 represents the computer, a circle 4 represents the routing network and a box 2 represents the FPGAs. The digital access unit 3 is not represented in FIG. 2. In the embodiment shown, computer 5 comprises three software applications 6, which are logic units in the understanding of the present application. It is to be understood, that more or less software applications are possible. Computer 5 further comprises a root unit 7. Root unit 7 is a logic unit configured to manage the system communication. A system configuration file 8 may be loaded into the root unit 7. With the configuration file 8 the system developer or the system user can specify different communication structures or topologies, i.e. define which logic units will communicate with each other as is explained in more detail in the following.

In the embodiment shown, the FPGAs 2 comprise three HDL entities 9, which are logic units in the understanding of the present application. It is to be understood, that more or less HDL entities are possible. Limits of the HDL entities must not necessarily correspond to limits of FPGAs, i.e. a HDL entity may extend over more than one FPGA or an FPGA may comprise several HDL entities. The FPGAs in box 2 further comprise one or multiple HDL entities 10 for service and configuration. A configuration operation loads a set of user designs embodied as configuration bit streams into the FPGAs of the FPGA system. Notice that the FPGA system may include a special preconfigured FPGA which is capable of configuring all remaining FPGAs. Examples for service operations are setup of clock frequencies or enable or disable reset signals.

Each logic unit including the root unit 7 and service-and-configuration-unit 10 is provided with an interface module 11 which is also called queue access control unit (QAC), i.e. an interface module 11 is coupled to each logic unit. The interface modules 11 provided for the software applications are realized as software modules. The interface modules 11 provided for the HDL entities are realized as HDL entities. Every logic unit is connected to the network 4 via an interface module 11. An interface module 11 is configured to exchange data with another interface module 11 via network 4 as indicated by arrows 12. For the logic units connected to the software applications 6 only one arrow 12 is shown because the communication additionally passes by the digital access unit. An interface module 11 is further configured to communicate with the logic unit 6, 7, 9 or 10 to which the interface module 11 is coupled as indicated in FIG. 2 by arrows 13.

Although FIG. 2 shows one interface module 11 for one logic unit 6, 7, 9 and 10, it is to be understood that more than one interface module 11 may be coupled to each logic unit. As is explained below in more detail, one interface module 11 may communicate only with one other interface module 11 at a time, thus if the logic unit has to communicate with several other logic units, more interface modules are coupled to the logic unit.

In the embodiment explained, each interface module 11 is provided with a memory and a counter. Each interface module 11 is provided with an own fixed identification number. The identification number may be stored in the memory of the interface modules 11, i. e. changeable, or the own identification number may be programmed as a constant.

When running or using the FPGA system 1, in a first phase FPGA configuration files are loaded into each of the FPGAs 2 for programming the FPGAs. Furthermore, resources of the FPGA system are configured, including for example global clocking and resets. Once the FPGAs 2 are programmed during the first phase, a second phase may be started. The second phase is a so-called system configuration phase. In the configuration phase virtual communication channels, in the present specification also called virtual channels, are established and logic units may be preloaded with data if necessary. Furthermore, all network elements are configured and on the computer 5 connections to external applications may be established. The configuration phase is controlled by the root unit 7 based on the configuration file 8.

A virtual communication channel between a first and a second interface module 11 is established by loading during the configuration phase into the first interface module—in addition to its own identification number—a second identification number which is the identification number of the second interface module. In the same way, second interface module may receive during the configuration phase the identification number of the first interface module. An established virtual channel is fully duplex, i.e. data transfer in both directions is possible. The first and second interface modules 11 are interconnected by the virtual channel over the routing network 4.

Figure 3:
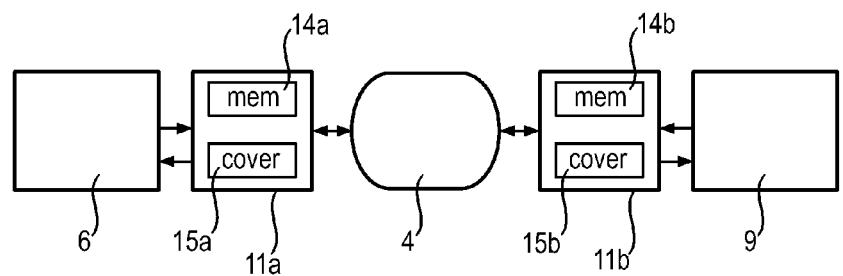
FIG. 3 is a diagram explaining a virtual channel.

An example of a virtual channel is shown in FIG. 3. A logic unit 6 may be a message generating unit, i.e. a logic unit which generates and sends messages. Logic unit 6 is coupled to first interface module 11*a*. Interface module 11*a* comprises a memory 14*a* and a counter 15*a*. The first interface module 11*a* is connected via the virtual channel established during the configuration phase over routing network 4 to the second interface module 11*b*. In other words, during configuration phase, the identification number of interface module 11*b* was loaded into memory 14*a*. The second interface module 11*b* is coupled to a logic unit 9. Logic unit 9 may be a message processing unit which receives messages and processes the received messages. During the configuration phase, the root unit 7 may also have sent to interface module 11*a* information concerning a maximum size of a data unit accepted by logic unit 9. This information is also stored in memory 14*a*. During the configuration phase, the root unit 7 may also have sent to interface module 11*a* a maximum count of unacknowledged data units accepted by logic unit 9. The counter 15*a* may be preloaded to the maximum count and count down with every data unit sent and count up with every data unit acknowledged. In another embodiment, counter 15*a* may count every sent data unit, count down with every acknowledged data unit and compare the actual count to the maximum count. Counter 15*a* acts as an evaluation unit evaluating how many unacknowledged data units have been sent. As already explained, interface module 11*b* may receive in the configuration phase the corresponding information for interface module 11*a* and logic unit 6. Of course, a virtual channel may also be established between two logic units 6, i.e. to software applications, or between two logic units 9, i.e. two HDL entities. It is to be understood, that for example interface module 11a is aware of the capacities of logic unit 9 after the configuration phase, while logic unit 6 is not.

In operation, i.e. in a third phase, which may also be called the execution phase, message generating unit 6 generates data which is to be transmitted to message receiving unit 9. The first interface module 11a receives the data from the message generating unit and sends the data in form of messages via the established virtual channel to the second interface module 11b. In other words, the first interface module 11a is configured to receive messages from the message generating unit and to send the received messages over the virtual channel to the second interface module with the help of a configuration message sent by a central configuration instance. A message comprises a header and a payload. The header comprises in the preferred embodiment 2 byte reserved for the identification number (ID) of the receiver, i.e. of the second interface module 11b and 2 byte reserved for the sender ID, i. e. the ID of interface module 11a. The header further comprises 2 byte reserved for a message type identification and 2 byte for indicating the payload size. Interface module 11a sends the data from logic unit 6 over the virtual channel to the second interface module 11b.

Figure 4:
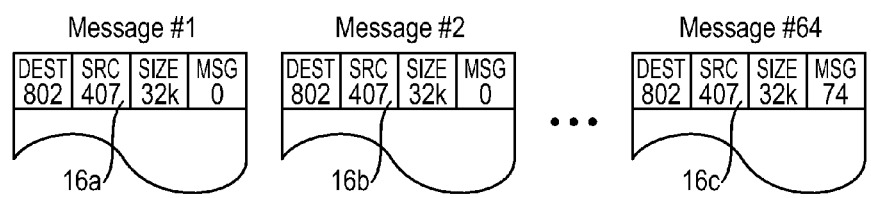
FIG. 4 is a diagram of exemplary embodiments of headers used in messages.
Figure 4:
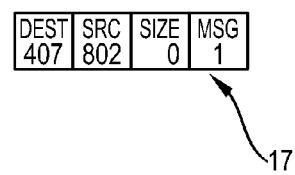

An example of the headers for a data transfer is given in FIG. 4. Interface module 11a may have received information about a maximum size of a data unit of 3 MB for logic unit 9 along with an information about the maximum number of allowable unacknowledged data units. The data unit generated by logic unit 6 and to be sent by interface module 11a may have a size of 2 MB. Interface module 11a checks whether the size is within the limit received during the configuration phase. If the size is within the limit, interface module 11a may send the data in messages comprising for example a payload of 32 kB each. A header 16a of the first message comprises a receiver ID of 802 designating interface module 11b, a sender ID of 407 designating interface module 11a, a payload size of 32 k and a message type ID 0. The message type ID 0 designates a sub-message, i.e. a part of a message. A header 16b of a second message is identical, as will be the header of following messages 3 to 63. A header 16c of a $64^{th}$ message has a message type ID of 74. As this is a non-zero message type, it indicates that this is the last sub-message and the data unit is completed. Interface module 11a may then set counter 15a to "1" for one data unit sent, or count down from the maximum count of unacknowledged data units stored in the configuration phase. Message type 74 may stand for a certain message type, it does not indicate end of message.

The first interface module 11a may comprise a memory 15a for storing an information about a maximum number of messages allowed to be send to the second interface module prior to receive an acknowledgement signal or acknowledgement message. In an embodiment the number of messages is calculated by the size of data units accepted by the receiving unit. The first interface module 11a may comprise an evaluation unit for evaluating how many messages have been transmitted since the last acknowledgement signal. In an embodiment the number of data units may be evaluated instead. Furthermore, the first interface module is configured to refuse data from the message generating unit, when the maximum number has been reached.

Message type IDs may also trigger a change in the behavior of an interface module 11, for example a change to a slave mode to receive messages from the root unit 7. Depending on the message type, the connected software application or the HDL entity may be enabled to send or receive data. This allows interface modules where the HDL entity or software application is not aware if the interface module is involved in a regular peer communication or a master-slave communication. The communication is decoupled from the logic units.

The second interface module 11b is configured to receive the messages over the virtual channel and to transmit the received messages to the message processing unit 9. In other words, the second interface module 11b is configured to receive the messages over the virtual channel and to transmit the received messages to the message processing unit with the help of a configuration message sent by a central configuration instance. The message processing unit 9 may assemble the incoming payload to a data unit before starting processing. Depending on the message processing unit 9, unit 9 may also start processing at once. Message processing unit 9 generates a processing complete signal when the received data unit has been processed and transmits the processing complete signal to the second interface module 11b. The second interface module 11b then sends an acknowledgement message to the first interface module 11a. A header 17 for an acknowledgement message is shown in FIG. 4. The header 17 of the acknowledgement signal comprises a receiver ID 407 which designates the interface module 11a, which has sent the data, a sender ID of 802 designating interface module 11b, a payload size of 0 because the acknowledgement message does not contain any data and a message type ID 1 which indicates "acknowledged". First interface module 11a then counts down "1" or re-augments the maximum count of unacknowledged data units if it was count down before.

In other words, a queue access control is realized, in which a so-called two-sided handshake method is established between two interface modules, the sending interface module signaling with the message type ID when a whole data unit has been transferred and the receiving interface acknowledging only when the associated logic unit has signalized that the data unit has been processed. As the sending interface module is aware of the capacity of the logic unit to which the receiving interface module is coupled, no data is sent when there is no receiving capacity. There is no need of any inquiry from the sending interface about the current capacity of the receiver. This would add latency to the communication path. The feature of acknowledging data only after processing saves the need of copying messages inside the memory or discarding incoming messages. No valuable memory area and memory bandwidth is wasted. No complex protocols are required and no communication bandwidth is wasted.

Furthermore, the logic units 6 and 9 are not aware of the communication process and need not to be adapted to the respective communication partner. The whole communication is effectuated by the interface modules 11 which are configurable during the configuration phase by the root unit 7.

Further to the above-described configuration of interface modules as so-called regular peers, the inventive method also allows for configuration of so-called slave peers. During the configuration phase, the slave interface module does not receive an ID of an interface module, to which a virtual channel is established. When receiving a message from another interface module, the slave interface module will get the sender ID included in the header of the received message and store this ID as receiver ID. The slave interface module can now answer to the sender interface module. This kind of configuration is valid for a certain sequence of messages, for example a query command message, followed by a query reply. Slave peers are commonly used for remote configuration, remote debugging and remote profiling. Again, it is not necessary, to fix the kind of peer in the logic unit. It is configurable in the interface module in every configuration phase. As it is possible to couple more than one interface module to a logic unit, even both configurations are possible at the same time in different virtual channels.

In an embodiment, it is also possible to change the virtual channel after a predefined number of messages or data units has been received or sent. Therefore, the interface module comprises a counter and a further memory to store a predefined further ID for establishing a virtual channel.

A possible implementation of an interface module which may be coupled to a software application is a software API (Application Programming Interface). The API provides the functions send( . . . ) and recv( . . . ) to the application. If the application requests a message operation that cannot be served, for example because the send operation is blocked or nothing has been received yet, the function automatically waits until the operation is possible. After the function returned, the software application can be sure that the requested operation has been performed.

Figure 5:
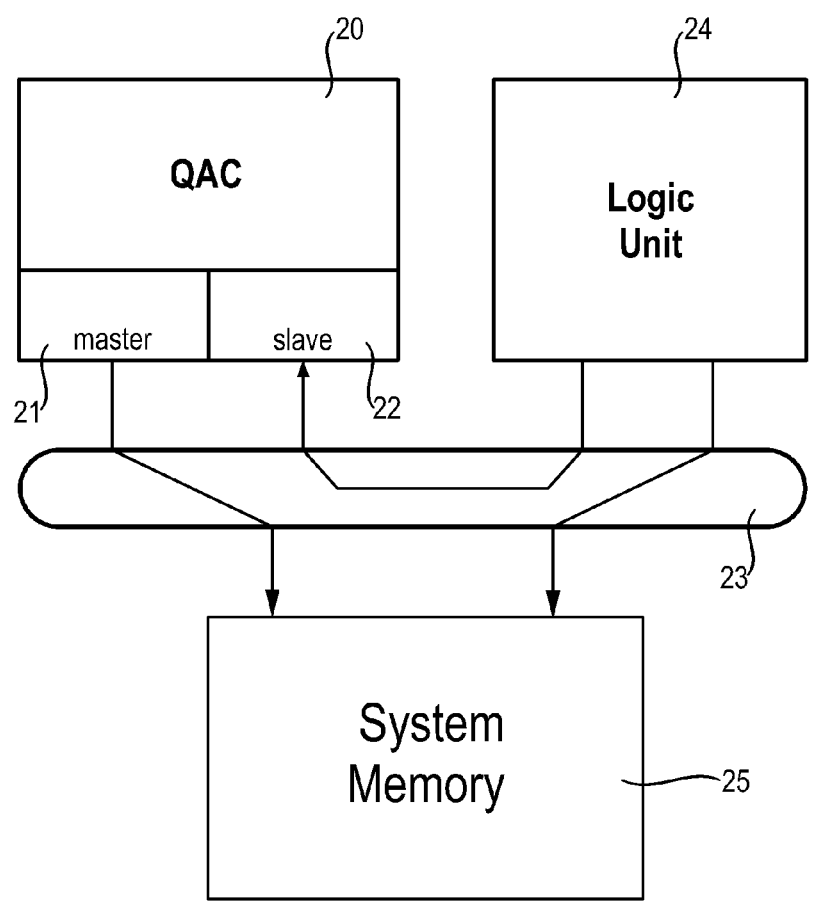
FIG. 5 is a diagram of an exemplary embodiment of an interface module.

A possible implementation of an interface module which may be coupled to a HDL is a FIFO-style module (First In First Out) which provides a two-sided handshake for individual data words. Another possible implementation of an interface module which may be coupled to a HDL is a DMAC-style HDL entity (Direct Memory Access Controller) which is further explained with reference to FIG. 5. An interface module 20 is coupled via a DMA bus master 21 and a register bus slave 22 to an embedded system bus 23. A logic unit 24 is also coupled to embedded system bus 23. The logic unit may be a message generating unit or a message processing unit. Both units are explained with reference to FIG. 5. A system memory 25 is coupled to the embedded system bus 23. In other words, interface module 20, logic unit 24 and system memory 25 are interconnected by embedded system bus 23.

For sending a data unit using interface module 20, the message generating unit 24 generates data and writes it into a continuous address space inside the system memory 25. Then the unit 24 checks whether the interface module 20 is capable of sending a message by reading register slave 22. Through the register slave 22 a system memory address, size and message type ID are provided. The interface module 20 then generates a direct memory access transfer for reading the message payload from system memory 25 and sends it to the receiving peer.

For receiving a data unit when using the DMAC-style interface module 20, the logic unit 24 which is now considered to be a receiving unit first checks, whether the interface module 20 has received another message by reading the register slave 22. The interface module 20 generates direct memory access transfers to write a message payload to system memory 25. The receiving unit 24 then retrieves system memory address, size and message type ID through the register slave 22. The receiving unit 24 processes the message payload from the system memory 25 and indicates when the message has been processed also through the register slave 22. The interface module 20 then generates an acknowledgement message to the sender.

In an embodiment, the inventive communication method and system is used for rapid prototyping in an FPGA system. In another embodiment, the inventive communication method and system is used for a supercomputer in an FPGA system. In both embodiments, the FPGA system 1 is configured for a single application and returns to idle mode after the application has finished. This results in a sequence of distinct system states.

The state of the system is controlled by the root unit 7, which preferably runs on computer 5. Computer 5 may be part of a system communication server. After being launched, the Communication Server first establishes contact to the FPGA system through the device access unit through any appropriate medium.

As explained previously, a system run starts with the FPGA programming phase, in which the root unit 7 transmits a sequence of messages containing the FPGA bit files. In the subsequent system configuration phase, the root unit 7 sets up a so-called network topology by transmitting a sequence of messages resembling the routing information and peer connection information. In other words, virtual channels are established. Furtheron, connections to external applications are established.

During the following execution phase, the root unit 7 provides error handling and system monitoring. In this phase, connections to external applications are active, i.e. messages will be accepted from external applications and transmitted through the communication network 4. Any logic unit in the system may send a certain message type ID (QUIT message) to root unit 7. As soon as root unit receives the QUIT message, the execution phase ends.

In the following evaluation phase, root unit 7 requests execution results from selected interface modules. After that, root unit 7 puts the FPGA system in a suspend mode.

In each system state, root unit 7 processes the corresponding section of the system configuration file 8. This makes the system configuration file 8 a complete description of the system and the application running in it. Among others, it contains the following descriptions:
  FPGA configuration bit streams to be loaded into the FPGAs 2. Notice that the configuration bit stream also contains all interface units implemented as HDL entities.
  Routing and peer connection information, i.e. virtual channels and information like maximum size of data units and maximum count of unacknowledged messages/data units.
  Connection to external software applications
  List of messages for initialization of the FPGA system states
  List of messages to launch the application
  List of messages for reading back the FPGA system states
  Messages to initialize and read back the FPGA system states are a powerful tool in system debugging and profiling. For example, consider a problem where the developed application tends to hang upon unknown conditions. A debug unit may be configured to detect a certain trigger event during the system configuration phase. During evaluation phase, the debug unit is asked to return the number of occurrences of that event along with some recorded properties of the last occurrence to help pinning down the problem. The additional debug messages may simply be added to the respective sections of the system configuration file.

Figure 6:
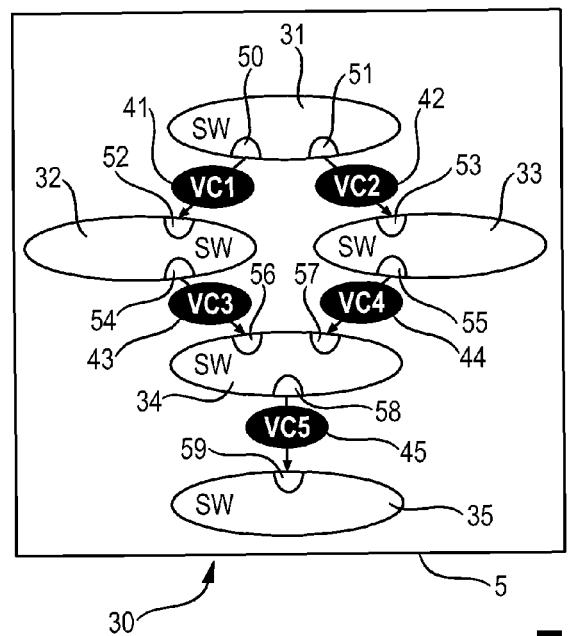
FIG. 6 is a diagram of a first exemplary topology for a first execution phase.

The debug approach becomes significantly more powerful when using multiple system configuration files 8. Consider an application where several data processing operations are connected to a data flow graph 30 as represented in FIG. 6. Five logic units are realized as software applications 31, 32, 33, 34 and 35. They are interconnected by virtual communication channels 41, 42, 43, 44 and 45 which are represented by arrows. The application may be a pure software reference implementation, known to be functionally correct and running on computer 5.

To establish a communication system according to a first topology with a data flow as shown in FIG. 6, software applications 31, 32 and 33 are provided with two interface modules each, whereas software application 34 is provided with three interface modules and software application 35 is provided with one interface module. The interface modules 50 to 59 are indicated in FIG. 6 in the form of semicircles. They are placed at the junctions between software applications 31, 32, 33, 34 and 35 and virtual channels 41, 42, 43, 44 and 45.

A first interface module 50 coupled to software application 31 may have the ID number 110 and a second interface module 51 coupled to the same software application 31 may have the ID number 112. A third interface module 52 which is coupled to software module 32 may have the ID number 114 and a fourth interface module 53 coupled to software module 33 may have the ID number 116. A fifth interface module 54 coupled to software module 32 may have the ID number 118 and a sixth interface module 55 coupled to software module 33 may have the ID number 120. A seventh interface module 56 coupled to software module 34 may have the ID number 122 and an eighth interface module 57 coupled to the same software module 34 may have the ID number 124. A ninth interface module 58 coupled also to software module 34 may have the ID number 126 and a tenth interface module 59 coupled to software module 35 may have the ID number 128. As explained above, interface modules 50 to 59 may be realized as a software API.

In the configuration phase controlled by a first configuration file 8, the root unit 7 sends configuration messages providing interface module 50 with the ID number 114 of interface module 52 to establish virtual channel 41. Root unit 7 further provides by configuration messages interface module 50 with an information about the maximal size of a data unit accepted by software application 32 and about the maximal count of unacknowledged data units for software application 32. In fact, the latter is information about storage capacity of software application 32. Root unit 7 may provide interface module 52 with ID number 110 of interface module 50 if virtual channel 41 is a bidirectional channel and interface modules 50 and 52 are regular peers.

In the configuration phase, root unit 7 further provides by configuration messages interface module 51 with the ID number 116 of interface module 53 to establish virtual channel 42. Root unit 7 provides in the same way interface module 51 also with information about the maximal size of a data unit accepted by software application 33 and about the maximal count of unacknowledged data units for software application 33. Root unit 7 may provide interface module 53 with ID number 112 of interface module 51 if virtual channel 42 is a bidirectional channel and interface modules 51 and 53 are regular peers. It is to be understood that software applications 31, 32 and 33 are unaware of the communication channels established. There is no need to change anything inside software applications 31, 32 and 33.

Still in the configuration phase, root unit 7 further provides interface module 54 with the ID number 122 of interface module 56 to establish virtual channel 43. Root unit 7 provides interface module 54 also with information about the maximal size of a data unit accepted by software application 34 and about the maximal count of unacknowledged data units for software application 34. Root unit 7 may provide interface module 56 with ID number 118 of interface module 54 if virtual channel 43 is a bidirectional communication channel and interface modules 54 and 56 are regular peers. In the same way virtual channels 44 and 45 are established.

It follows the execution phase. Virtual channels 41 to 45 are used to transfer data between the logic units 31 to 35. After the execution phase follows the evaluation phase and root unit 7 requests execution results from selected interface modules. Then, the FPGA system is in a suspend mode.

Figure 7:
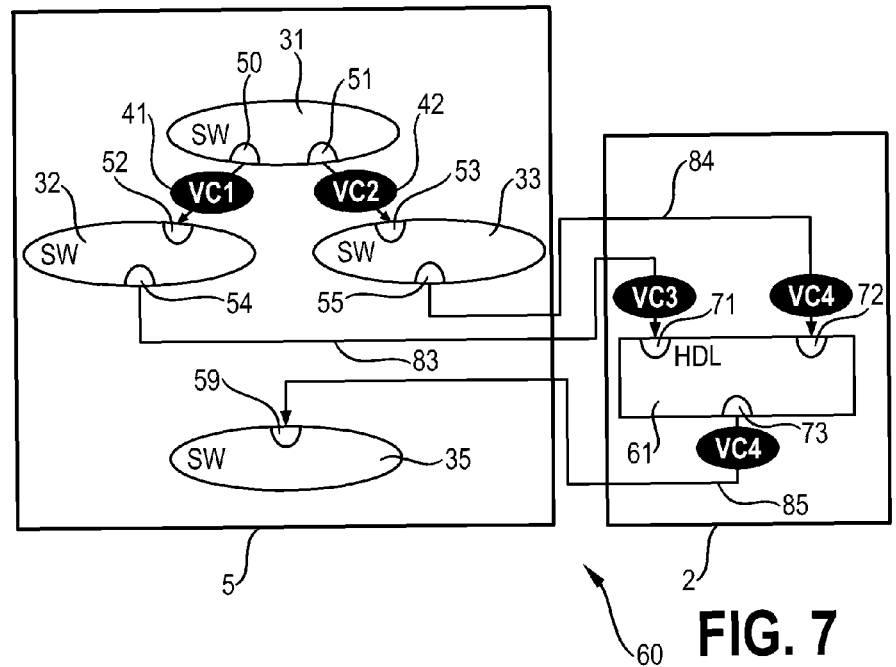
FIG. 7 is a diagram of a second exemplary topology for a second execution phase.

A second configuration file 8 may now contain all information necessary to establish an application according to a second topography corresponding to a data flow graph 60 as shown in FIG. 7. Software applications 31, 32 and 33 running on computer 5 remain unchanged with interface modules 50, 51, 52, 53, 54 and 55 coupled thereto. The second configuration file 8 comprises the same information as the first configuration file 8 to establish in the configuration phase virtual channels 41 and 42.

However, software application 34 has been replaced by a HDL entity 61 which is realized in one or more of the FPGAs 2 comprised in the FPGA system 1. HDL entity 61 is designed to have the same functionality as software application 34. HDL entity 61 is provided with an interface module 71 which may have the ID number 222, an interface module 72 which may have the ID number 224 and an interface module 73 which may have the ID number 226. As explained above, interface modules 71, 72 and 73 may be realized for example as FIFO-style module or as DMAC-style HDL entity.

In the configuration phase, root unit 7 provides interface module 54 with the ID number 222 of interface module 71 to establish a virtual channel 83. Root unit 7 provides interface module 54 also with information about the maximal size of a data unit accepted by HDL entity 61 and about the maximal count of unacknowledged data units allowable for HDL entity 61. Virtual channel 43 in FIG. 6 and virtual channel 83 in FIG. 7 are both marked with VC3, indicating, that the same data communication will flow over these two virtual channels. Software application 32 is unaware of the fact that software application 34 has been exchanged against HDL entity 61.

Still in the configuration phase, root unit 7 provides interface module 55 with the ID number 224 of interface module 72 to establish a virtual channel 84. Root unit 7 provides interface module 55 also with information about the maximal size of a data unit accepted by HDL entity 61 and about the maximal count of unacknowledged data units allowable for HDL entity 61. Root unit 7 further provides interface module 73 with the ID number 128 of interface module 59 to establish a virtual channel 85 to the interface module 59 which is coupled to software application 35 which remained unchanged. Root unit 7 provides interface module 73 also with information about the maximal size of a data unit accepted by software application 35 and about the maximal count of unacknowledged data units allowable for software application 35. As mentioned before, root unit 7 may also provide for example interface module 72 with the ID number of interface module 55, and so on.

In the following execution phase, virtual channels 41, 42, 83, 84 and 85 are used to transfer data between the logic units 31, 32, 33, 61 and 35. After the execution phase follows another evaluation phase and root unit 7 requests execution results from selected interface modules. The execution results from the first and the second execution phase can now be compared. Only part of the whole application, i.e. software application 34 was replaced. Any malfunction due to HDL implementation errors which occurred during the second execution phase can therefore be localized in HDL entity 61. Of course, software application 34 is still on computer 5, but in the configuration phase no virtual channels were established to software application 34.

The approach of alternative system configuration files 8 now allows a step-by-step approach of transforming a pure software implementation into a pure HDL design as intended for an ASIC silicon design. Each processing function is individually ported into a HDL design unit which is capable of processing the same input messages and producing the same output messages. Two system configuration files are used in two separate system runs, one for the original virtual channel configurations, one using the new HDL design unit. The users of the FPGA system now have a powerful method of isolating potential problems by exchanging parts of the HDL implementation with the original software implementation, purely by using alternative system configuration files. Since the approach requires no re-synthesis of the FPGA designs (which typically take several hours), it saves a large amount of time for error isolation. It should be understood that further system runs based on further configuration files with still other topologies comprising possibly further logic units may follow.

Figure 8:
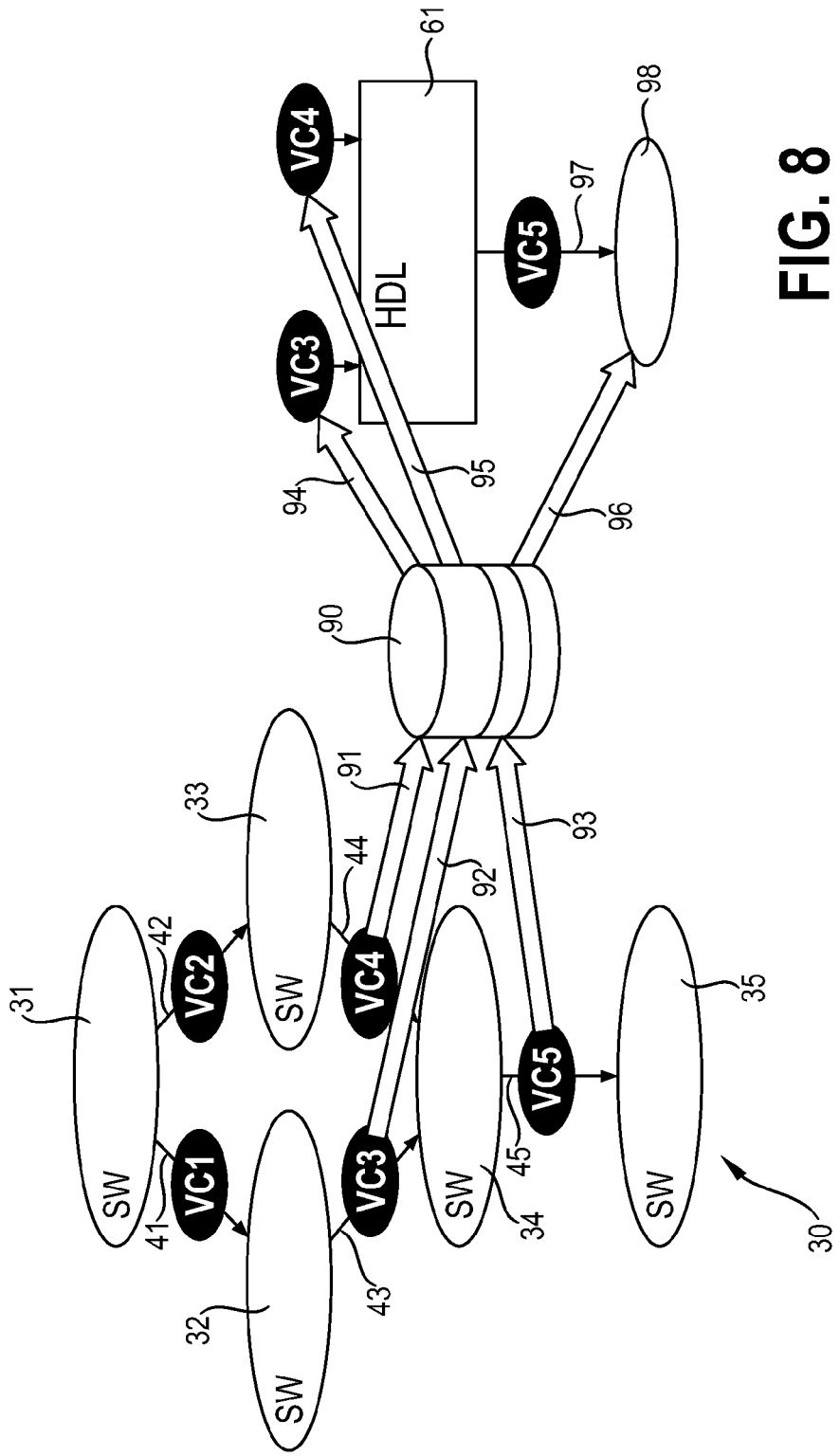
FIG. 8 is a diagram illustrating an embodiment of the inventive method.

FIG. 8 shows another debug technology possible with the inventive communication method and system. On the left the data flow graph 30 of FIG. 6 is represented comprising logic units 31 to 35 realized as software applications and interconnected by virtual channels. On the right side only the HDL entity 61 as part of the data flow graph 60 of FIG. 7 is shown. A message recorder 90 which may be implemented in computer 5 records all messages exchanged via virtual channels 43, 44 and 45 during a first execution phase as visualized by arrows 91, 92 and 93, i.e. the messages transmitted over the virtual channels which are connected to software application 34. Message recorder 90 is transparent for the messages. The recorded messages of virtual channels 43 and 44, i. e. those channels through which data respective messages are sent to software application 34, are then entered to HDL entity 61 as indicated by arrows 94 and 95. HDL entity 61 processes the data and outputs via a virtual channel 97 output data which should be the same as the output data of software application 35. In a next step 98, the data output from HDL entity 61 is compared to the data output from software application 35 and registered by message recorder 90.

This message comparison is another powerful debug technology. As the message sequence into the reference implementation, for example software, is recorded and replayed into the unit under test, for example FPGA, the sequence of messages generated by the reference implementation and the unit under test can be compared. This allows exact isolation of the differences as well as simulation of isolated parts of the design in event-based HDL simulators at acceptable speed.

Figure 9:
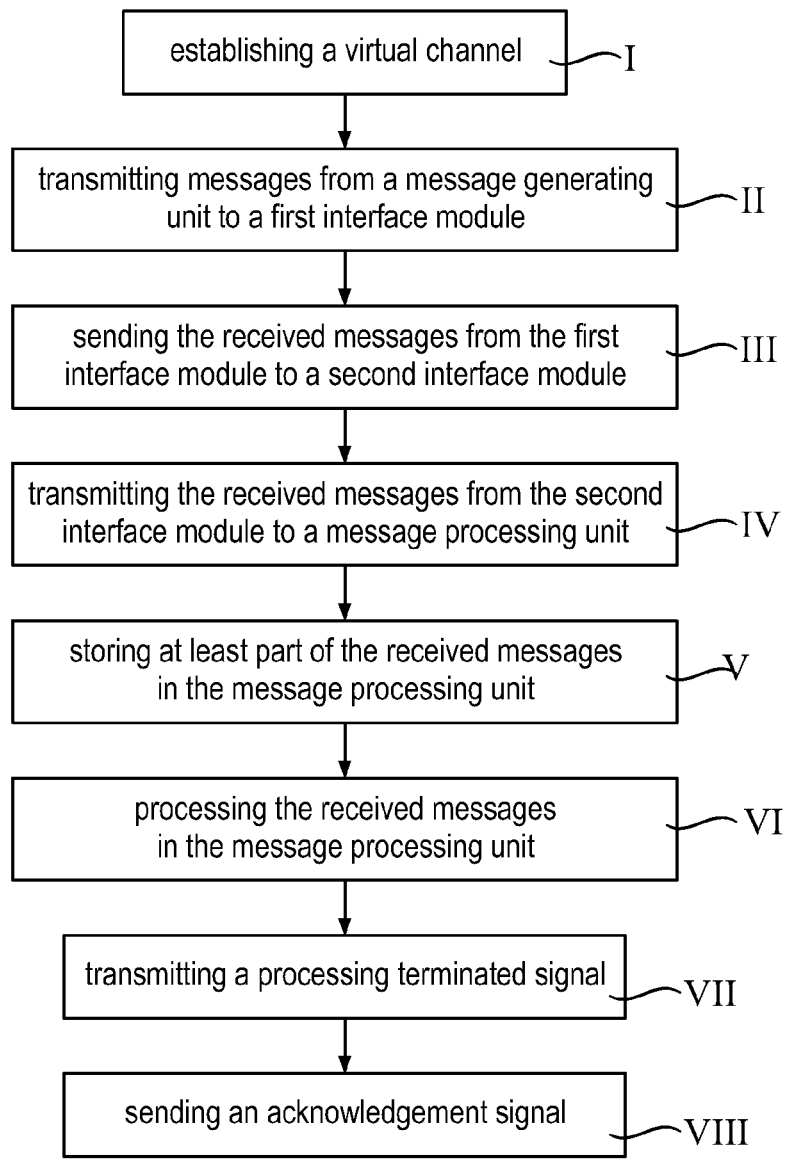
FIG. 9 is a flow diagram illustrating an embodiment of the inventive method.
Figure 10:
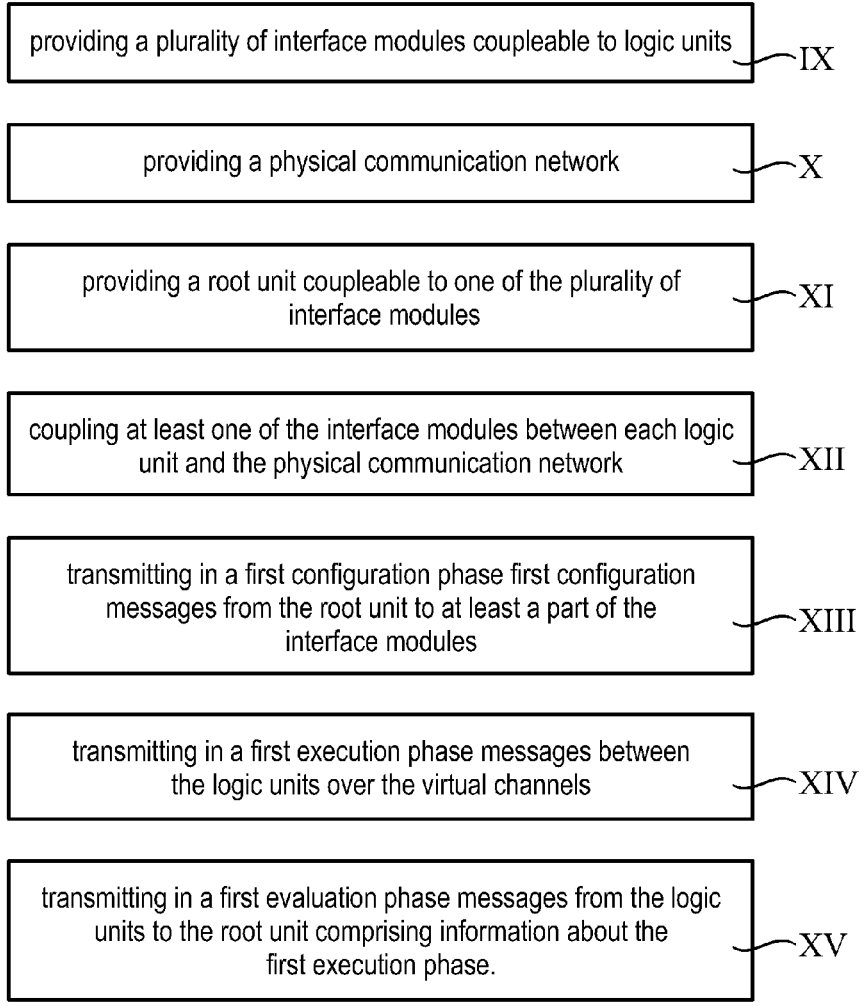
FIG. 10 is a flow diagram illustrating an embodiment of the inventive method.

Embodiments of the inventive communication methods are now summarized with reference to FIGS. 9 and 10. In a step I in FIG. 9 a virtual channel is established over a routing network between two interface modules, wherein a first interface module is coupled to a message generating unit and a second interface module is coupled to a message processing unit. In a step II messages from the message generating unit are transmitted or handed over to the first interface module. Handed over and transmitted are used in the context of this specification for messages which are not sent over communication channels but rather transferred between an interface module and the unit it is coupled to. In a step III the messages which have been handed over are sent from the first interface module over the virtual channel to the second interface module. In a step IV the received messages are handed over from the second interface module to the message processing unit. In a step V at least part of the received messages are stored in the message processing unit. In a step VI the received messages are processed in the message processing unit. In a step VII a processing complete signal or processing terminated signal is transmitted from the message processing unit to the second interface module, after the received messages have been processed. In a step VIII an acknowledgement signal is sent from the second interface module to the first interface module over the virtual channel after reception of the processing complete signal.

FIG. 10 illustrates an embodiment of the inventive communication method with a plurality of interface modules which are configured in a configuration phase. In a step IX, which is not a step which follows step VIII, a plurality of interface modules is provided which may be coupled to logic units, each interface module being identified by a fixed identification number. In a step X a physical communication network is provided and in a step XI a root unit is provided which may be coupled to one of the plurality of interface modules. In a step XII at least one of the interface modules is coupled between each logic unit and the physical communication network. In a step XIII first configuration messages are transmitted in a first configuration phase from the root unit to at least a part of the interface modules. The first configuration messages provide the at least part of interface modules with an identification number of another interface module for establishing a virtual communication channel between the two interface modules.

In an optional step XIV messages between the logic units are transmitted in a first execution phase over the virtual channels which have been established during the first configuration phase between their respective interface modules. In a further optional step XV messages from the logic units are transmitted in a first evaluation phase to the root unit. The messages comprise information about the first execution phase.

Although the communication system and the communication method have been described in detail through some exemplary embodiments, these embodiments are not exhaustive, various variations and modifications can be made therein by those skilled in the art without departing from the spirit and scope of the invention. Equivalents may be substituted for elements thereof and adaptations to a particular situation to the teachings of the invention can be done without departing from the essential scope thereof. Therefore, the present invention is not limited to these embodiments, the scope of which is only defined by the appended claims.

The invention claimed is:

1. A communication system for testing field programmable gate arrays (FPGA) comprising
   a first interface module located in one of a computer and FPGA which is coupled to a message generating unit;
   a second interface module located in the other one of the computer and the FPGA which is coupled to a message processing unit;
   the first and second interface modules being interconnected by a virtual channel over a routing network;
   the first interface module is configured to receive messages from the message generating unit and to send the received messages over the virtual channel to the second interface module;
   the second interface module is configured to receive the messages over the virtual channel and to transmit the received messages to the message processing unit;
   the second interface module is further configured to receive a processing complete signal from the message processing unit when the received messages have been processed in the message processing unit and is further configured to send an acknowledgement signal to the first interface module after reception of the processing complete signal, wherein
   the first interface module comprises a memory for storing an information about a maximum number of messages allowed to be send to the second interface module prior to receive an acknowledgement signal;
   the first interface module further comprises an evaluation unit for evaluating how many messages have been transmitted since the last acknowledgement signal; and the first interface module being configured to refuse messages from the message generating unit, when the maximum number has been reached.

2. The communication system according to claim 1, wherein
each interface module comprises an identification number memory with a first identification number stored identifying the interface module and a second identification number stored identifying the interface module to which a virtual channel is established;
the second identification number is
configurable once; or
changed multiple times after a predefined sequence of message transactions.

3. The communication system according to claim 1, wherein
each interface module comprises an identification number memory with a first identification number stored identifying the interface module and a second identification number stored identifying the interface module to which a virtual channel is established;
the messages comprise a header, the header comprising the first identification number and the second identification number stored in the interface module having sent the message and a message type identification number,
the interface modules being configured to store the received first identification number as the second identification number if the header comprises a specific message type identification number.

4. The communication system according to claim 1, further comprising
a root unit coupled to a third interface module;
the root unit being configured to send configuration data to the first and the second interface module.

5. The communication system according to claim 4, further comprising
a plurality of interface modules interconnected by the routing network, wherein each of the interface units is coupled to a different logic unit comprising message generating units and message processing units;
the root unit being configured to store different topologies interconnecting different interface modules by virtual channels and to configure the communication system with either of the different topologies by sending configuration messages to the interface modules;
the configuration messages comprising the identification number of the logic unit to which a virtual channel is to be established, and the maximum number of unacknowledged messages allowable for the message processing unit coupled to the interface module to which a virtual channel is to be established.

6. The communication system according to claim 5, wherein
data units of a specified size are exchanged between the message generating units and the message processing units, each data unit being sent divided into a number of messages; the configuration messages comprise an information about the maximum size of the data unit and the maximum count of unacknowledged data units allowable for the message processing unit coupled to the interface module to which a virtual channel is to be established.

7. The communication system according to claim 6, wherein
the processing complete signal from the message processing unit is sent when the received data unit has been processed in the message processing unit.

8. The communication system according to claim 1, wherein
the message generating unit is a logic unit out of one of a software application and a Hardware Description Language design entity comprised in a field programmable gate array; and
the message processing unit is a logic unit out of one of a software application and a Hardware Description Language design entity comprised in a field programmable gate array.

9. A communication method for a system comprising:
a first interface module located in one of a computer and FPGA which is coupled to a message generating unit, a second interface module located in the other one of the computer and the FPGA which is coupled to a message processing unit,
said method comprising the following steps:
establishing a virtual channel over a routing network between the two interface modules;
transmitting messages from the message generating unit to the first interface module;
sending the received messages from the first interface module over the virtual channel to the second interface module;
transmitting the received messages from the second interface module to the message processing unit;
storing at least part of the received messages in the message processing unit;
processing the received messages in the message processing unit;
transmitting a processing complete signal from the message processing unit to the second interface module, when the received messages have been processed;
sending an acknowledgement signal from the second interface module to the first interface module over the virtual channel after reception of the processing complete signal,
evaluating in the first interface module how many messages have been sent to the second interface module since the reception of the last acknowledgement signal;
comparing in the first interface module the evaluated number of sent messages with a maximum number of allowable messages to be sent to the second interface module prior to receive an acknowledgement signal; and
refusing the reception of messages from the message generating unit, when the maximum number has been reached.

10. A communication method for communication between a plurality of logic units in a communication system which comprises:
the plurality of logic units,
a plurality of interface modules coupleable to the logic units, each interface module being identified by a fixed identification number;
a physical communication network;
a root unit coupleable to one of the plurality of interface modules; and
wherein at least one of the interface modules is coupled between each logic unit and the physical communication network;
said method comprising the steps of:
transmitting in a first configuration phase first configuration messages from the root unit to at least a part of the interface modules; the first configuration messages providing at least part of the interface modules with an identification number of another interface module for establishing a virtual communication channel between the two interface modules; and transmitting in a first execution phase messages between the logic units over the virtual channels established during the first configuration phase between their respective interface modules;

wherein the step of transmitting messages between the logic units comprises transmitting data units using a handshake protocol between the interface modules, wherein an acknowledged signal is only sent from the receiving interface module after a received data unit has been processed in the receiving logic unit.

11. The communication method of claim 10, further comprising:

transmitting in a first evaluation phase messages from the logic units to the root unit comprising information about the first execution phase.

12. The communication method of claim 11, further comprising:

transmitting in a second configuration phase second configuration messages from the root unit to at least a part of the interface modules; the second configuration messages providing each interface module with an identification number of another interface module for establishing a virtual communication channel between the logic unit to which the interface module is coupled and a further logic unit, wherein at least one of the virtual communication channels established in the second configuration phase differ from the virtual communication channels established in the first configuration phase.

13. The communication method of claim 11, further comprising:

transmitting in a second configuration phase second configuration messages from the root unit to at least a part of the interface modules; the second configuration messages providing each interface module with an identification number of another interface module for establishing a virtual communication channel between the logic unit to which the interface module is coupled and a further logic unit, wherein at least a part of the interface modules receiving configuration messages differ from the interface modules which received configuration messages in the first configuration phase.

14. The communication method of claim 13, further comprising:

transmitting in a second execution phase the same messages between the logic units as in the first execution phase over the virtual channels established during the second configuration phase.

15. The communication method of claim 14, further comprising:

transmitting in a second evaluation phase messages from the logic units to the root unit comprising information about the second execution phase; and comparing the information about the first execution phase and the information about the second execution phase.

16. The communication method of claim 10, wherein the first configuration messages further comprise information about the logic unit coupled to the interface module to which the virtual channel is established, the information comprising at least one out of a maximum size of a data unit a maximum count of unacknowledged data units allowed.

* * * * *